(12) United States Patent
Koizumi et al.

(10) Patent No.: US 7,728,493 B2
(45) Date of Patent: Jun. 1, 2010

(54) PIEZOELECTRIC/ELECTROSTRICTIVE MATERIAL, PIEZOELECTRIC/ELECTROSTRICTIVE BODY, AND PIEZOELECTRIC/ELECTROSTRICTIVE ELEMENT

(75) Inventors: Takaaki Koizumi, Tajimi (JP); Hideki Shimizu, Ohbu (JP)

(73) Assignee: NGK Insulators, Ltd., Nagoya (JP)

( * ) Notice: Subject to any disclaimer, the term of this patent is extended or adjusted under 35 U.S.C. 154(b) by 72 days.

(21) Appl. No.: 11/766,265

(22) Filed: Jun. 21, 2007

(65) Prior Publication Data

US 2008/0111452 A1 May 15, 2008

Related U.S. Application Data

(60) Provisional application No. 60/865,874, filed on Nov. 15, 2006.

(30) Foreign Application Priority Data

Mar. 14, 2007 (JP) .............................. 2007-065921

(51) Int. Cl.
*H01L 41/187* (2006.01)
(52) U.S. Cl. ................ 310/358; 252/62.9 PZ
(58) Field of Classification Search ................ 310/324, 310/358; 252/62.9 R, 62.9 PZ
See application file for complete search history.

(56) References Cited

U.S. PATENT DOCUMENTS

| 6,231,779 B1 * | 5/2001 | Chiang et al. ............ 252/62.9 R |
| 6,396,196 B1 * | 5/2002 | Takeuchi et al. ............ 310/324 |
| 7,141,911 B2 * | 11/2006 | Kita et al. ................. 310/317 |
| 2004/0256953 A1 * | 12/2004 | Kitagawa et al. ............ 310/324 |

FOREIGN PATENT DOCUMENTS

| JP | 44-17103 | 7/1969 |
| JP | 45-8145 | 3/1970 |

OTHER PUBLICATIONS

Takenaka et al. "Mechanical Properties of $(Bi_{1/2}Na_{1/2})TiO_3$-based Piezoelectric Ceramics". *Silicates Industriels* 1993/7-8, p. 136-142.

* cited by examiner

*Primary Examiner*—Walter Benson
*Assistant Examiner*—Derek J Rosenau
(74) *Attorney, Agent, or Firm*—Burr & Brown (57) ABSTRACT

A piezoelectric/electrostrictive material having a nonstoichiometric composition represented by a general formula (1):

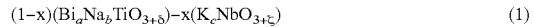

$$(1-x)(Bi_aNa_bTiO_{3+\delta})-x(K_cNbO_{3+\zeta}) \qquad (1)$$

wherein $0.01 \leq x < 0.08$, $a < 0.5$, $1.01 \leq (a/b) \leq 1.08$, $0.92 \leq (a+b)/c < 0.99$, and $0.9 \leq c \leq 1.1$, and $\zeta \neq 0$ when $\delta = 0$ and $\delta \neq 0$ when $\zeta = 0$.

14 Claims, 3 Drawing Sheets

PIEZOELECTRIC/ELECTROSTRICTIVE MATERIAL, PIEZOELECTRIC/ELECTROSTRICTIVE BODY, AND PIEZOELECTRIC/ELECTROSTRICTIVE ELEMENT

BACKGROUND OF THE INVENTION

1. Field of the Invention

The present invention relates to a piezoelectric/electrostrictive material, a piezoelectric/electrostrictive body, and a piezoelectric/electrostrictive element.

2. Description of the Related Art

Hitherto, piezoelectric/electrostrictive elements have been known to control a small displacement on the order of submicrons. In particular, in addition to their excellent controllability at a small displacement, piezoelectric/electrostrictive film elements have excellent characteristics, such as a high electromechanical conversion efficiency, high-speed responsivity, high durability, and lower power consumption. The piezoelectric/electrostrictive film elements include a piezoelectric/electrostrictive portion composed of a piezoelectric/electrostrictive ceramic composition (piezoelectric/electrostrictive material) and electrodes alternately stacked on a ceramic substrate. The piezoelectric/electrostrictive elements have found use in a variety of applications, such as piezoelectric pressure sensors, probe drive mechanisms in scanning tunneling microscopes, rectilinear guide mechanisms in ultraprecision machining apparatuses, hydraulic servo valves, videocassette recorder heads, pixels in flat-panel image display apparatuses, and ink-jet printer heads.

The piezoelectric/electrostrictive ceramic composition of a piezoelectric/electrostrictive portion has also been studied. For example, Japanese Examined Patent Application Publications No. 44-17103 and No. 45-8145 disclose a piezoelectric/electrostrictive ceramic composition of a $Pb(Mg_{1/3}Nb_{2/3})O_3$—$PbZrO_3$—$PbTiO_3$ (PZT) three-component solid solution or a piezoelectric/electrostrictive ceramic composition in which part of Pb atoms in the PZT are substituted by Si or La. The piezoelectric/electrostrictive characteristics of a piezoelectric/electrostrictive element primarily depend on a piezoelectric/electrostrictive portion. Thus, a piezoelectric/electrostrictive element that includes a piezoelectric/electrostrictive portion having excellent piezoelectric/electrostrictive characteristics (for example, piezoelectric distortion constant) is desired.

In recent years, environmental impacts such as leaching of lead (Pb) caused by acid rain have been becoming an important issue. In consideration of the environmental impacts, Japanese Unexamined Patent Application Publications Nos. 2001-261435, 2004-75449, 51-12700, and 11-171643, Japanese Patent No. 3830345, and Tadashi Takenaka et al., SILICATES INDUSTRIELS, 7-8, 136-142 (1993) describe lead-free piezoelectric/electrostrictive materials, such as a (Bi,Na)$TiO_3$ piezoelectric/electrostrictive ceramic composition, which can provide a piezoelectric/electrostrictive body or a piezoelectric/electrostrictive element each having excellent piezoelectric/electrostrictive characteristics.

However, piezoelectric/electrostrictive bodies or piezoelectric/electrostrictive elements formed of the lead-free piezoelectric/electrostrictive ceramic compositions hardly achieve a larger displacement than piezoelectric/electrostrictive bodies formed of PZT compositions. Hence, the PZT compositions are presently superior to the lead-free compositions in piezoelectric/electrostrictive characteristics. Thus, there is a need to develop a lead-free piezoelectric/electrostrictive material that can provide a piezoelectric/electrostrictive body and a piezoelectric/electrostrictive element each having excellent piezoelectric/electrostrictive characteristics.

SUMMARY OF THE INVENTION

In view of the above-mentioned problems, it is an object of the present invention to provide a piezoelectric/electrostrictive material that can provide a piezoelectric/electrostrictive element having excellent piezoelectric/electrostrictive characteristics. The piezoelectric/electrostrictive element includes a piezoelectric/electrostrictive body having excellent piezoelectric/electrostrictive characteristics or a piezoelectric/electrostrictive portion exhibiting small asymmetric variations of a D-E curve or a large piezoelectric displacement. It is another object of the present invention to provide a piezoelectric/electrostrictive body having excellent piezoelectric/electrostrictive characteristics.

It is still another object of the present invention to provide a piezoelectric/electrostrictive element that includes a piezoelectric/electrostrictive portion exhibiting small asymmetric variations of a D-E curve or a large piezoelectric displacement and has excellent piezoelectric/electrostrictive characteristics.

As a result of diligent investigation for the purpose of overcoming the above-mentioned problems, the present inventors perfected the present invention by using a piezoelectric/electrostrictive material having a predetermined composition formula.

The present invention provides the following piezoelectric/electrostrictive materials, piezoelectric/electrostrictive bodies, and piezoelectric/electrostrictive elements.

[1] A piezoelectric/electrostrictive material having a non-stoichiometric composition represented by a general formula (1):

$$(1-x)(Bi_aNa_bTiO_{3+\delta})-x(K_cNbO_{3+\zeta}) \quad (1)$$

wherein $0.01 \leq x < 0.08$, $a < 0.5$, $1.01 \leq (a/b) \leq 1.08$, $0.92 \leq (a+b)/c < 0.99$, and $0.9 \leq c \leq 1.1$, and $\zeta \neq 0$ when $\delta = 0$ and $\delta \neq 0$ when $\zeta = 0$.

[2] The piezoelectric/electrostrictive material according to [1], wherein x satisfies the relationship of $0.02 \leq x \leq 0.05$ in the general formula (1).

[3] The piezoelectric/electrostrictive material according to [1], wherein x satisfies the relationship of $0.04 \leq x < 0.08$ in the general formula (1).

[4] A piezoelectric/electrostrictive body formed of the piezoelectric/electrostrictive material according to any one of [1] to [3].

[5] The piezoelectric/electrostrictive body according to [4], wherein the piezoelectric/electrostrictive body is in the form of sheet.

[6a] A piezoelectric/electrostrictive element including a ceramic substrate and a piezoelectric/electrostrictive drive. The piezoelectric/electrostrictive drive includes at least one membranous piezoelectric/electrostrictive portion formed of the piezoelectric/electrostrictive material according to any one of [1] to [3] and at least two membranous electrodes electrically connected to the piezoelectric/electrostrictive portion. The piezoelectric/electrostrictive portion is fixed directly onto the substrate or via one of the electrodes onto the substrate.

[7] The piezoelectric/electrostrictive element according to [6], wherein the at least one piezoelectric/electrostrictive portion is a plurality of piezoelectric/electrostrictive portions, and each of the plurality of piezoelectric/electrostrictive portions and each of the electrodes are alternately stacked such that each piezoelectric/electrostrictive portion is sandwiched between a pair of the electrodes.

[8] The piezoelectric/electrostrictive element according to [6] or [7], wherein the substrate includes a thin zirconia diaphragm portion and a thick zirconia portion disposed around the diaphragm portion, the diaphragm portion and the thick portion forming a cavity communicating with the outside of the substrate, and the piezoelectric/electrostrictive drive is disposed on the diaphragm portion opposite the cavity.

[9] The piezoelectric/electrostrictive element according to [8], wherein the diaphragm portion can vibrate in synchronization with the movement of the piezoelectric/electrostrictive drive and thereby the piezoelectric/electrostrictive element can be used as a sensor.

[10] The piezoelectric/electrostrictive element according to [8] or [9], wherein when the piezoelectric/electrostrictive portion is fixed on the substrate via one of the electrodes, the effective area of the electrode disposed on the substrate is 0.45 to 0.5 times the area of a two-dimensional image of the cavity projected on the substrate, the ratio ($t_p/t_d$) of the thickness ($t_p$) of the piezoelectric/electrostrictive portion to the thickness ($t_d$) of the diaphragm portion is in the range of 1 to 1.5, and the degree of variability of the ratio ($|Ec^+|/|Ec^-|$) of a positive coercive electric field ($Ec^+$) to a negative coercive electric field ($Ec^-$) at a bipolar driving frequency in the range of 1 to 100 Hz is 10% or less.

[11] The piezoelectric/electrostrictive element according to [8], wherein when the piezoelectric/electrostrictive portion is fixed on the substrate via one of the electrodes, the effective area of the electrode disposed on the substrate is 0.45 to 0.5 times the area of a two-dimensional image of the cavity projected on the substrate, the ratio ($t_p/t_d$) of the thickness ($t_p$) of the piezoelectric/electrostrictive portion to the thickness ($t_d$) of the diaphragm portion is in the range of 1 to 1.5, and the displacement of the diaphragm portion during unipolar driving is at least 0.2 μm.

A piezoelectric/electrostrictive material according to the present invention includes a piezoelectric/electrostrictive body or a piezoelectric/electrostrictive portion each having excellent piezoelectric/electrostrictive characteristics. A piezoelectric/electrostrictive material according to the present invention can be used to produce a piezoelectric/electrostrictive element exhibiting small asymmetric variations of a D-E curve or a large piezoelectric displacement and having excellent piezoelectric/electrostrictive characteristics.

A piezoelectric/electrostrictive body according to the present invention has excellent piezoelectric/electrostrictive characteristics.

A piezoelectric/electrostrictive element according to the present invention includes a piezoelectric/electrostrictive portion and has excellent piezoelectric/electrostrictive characteristics, such as small asymmetric variations of a D-E curve or a large piezoelectric displacement.

DESCRIPTION OF THE PREFERRED EMBODIMENTS

The present invention will now be described with reference to the preferred embodiments. However, the present invention is not limited to the following embodiments. It will be recognized by those skilled in the art that variations and modifications may be made to the following embodiments without departing from the gist of the present invention. These variations and modifications are also intended to be within the scope of the present invention.

1. Piezoelectric/Electrostrictive Material

A piezoelectric/electrostrictive material according to an embodiment of the present invention has a nonstoichiometric composition represented by the following general formula (1).

$$(1-x)(Bi_aNa_bTiO_{3+\delta})-x(K_cNbO_{3+\zeta}) \quad (1)$$

wherein $0.01 \leq x < 0.08$, $a < 0.5$, $1.01 \leq (a/b) \leq 1.08$, $0.92 \leq (a+b)/c < 0.99$, and $0.9 \leq c \leq 1.1$, and $\zeta \neq 0$ when $\delta = 0$ and $\delta \neq 0$ when $\zeta = 0$.

Such a nonstoichiometric composition can provide a piezoelectric/electrostrictive body having excellent piezoelectric/electrostrictive characteristics or a piezoelectric/electrostrictive element having a piezoelectric/electrostrictive portion, such as a sensor. The term "piezoelectric/electrostrictive material" used herein encompasses "porcelain" and "single crystal."

When a piezoelectric/electrostrictive material has a composition represented by the general formula (1), the average particle size of crystal grains constituting a piezoelectric/electrostrictive body or a piezoelectric/electrostrictive portion each formed of the piezoelectric/electrostrictive material is generally 7 μm or less, preferably in the range of 1 to 5 μm, and more preferably in the range of 1 to 3 μm. Thus, use of a piezoelectric/electrostrictive material according to the present invention can provide a piezoelectric/electrostrictive body or a piezoelectric/electrostrictive portion each composed of crystal grains having a relatively small particle size. Thus, the piezoelectric/electrostrictive body or the piezoelectric/electrostrictive portion can have high mechanical strength. In addition, use of a piezoelectric/electrostrictive material according to the present invention can increase the density of the piezoelectric/electrostrictive body or the piezoelectric/electrostrictive portion. Hence, both high mechanical strength and excellent piezoelectric/electrostrictive characteristics can be achieved at the same time.

When "x" in the general formula (1) satisfies $0.01 \leq x < 0.08$, the piezoelectric/electrostrictive characteristics of the piezoelectric/electrostrictive body or the piezoelectric/electrostrictive portion can be improved remarkably. When "x" in the general formula (1) is less than 0.01, the contents of niobium (Nb) and potassium (K) are too low to improve the piezoelectric/electrostrictive characteristics. When "x" in the general formula (1) is 0.08 or more, the piezoelectric/electrostrictive body has poor piezoelectric/electrostrictive characteristics.

In a piezoelectric/electrostrictive element including a membranous piezoelectric/electrostrictive portion formed on a substrate, the stress applied to the piezoelectric/electrostrictive portion depends on (i) the elastic constant of the piezoelectric/electrostrictive portion and (ii) difference in thermal expansion coefficient between the piezoelectric/electrostrictive portion and the substrate. The stress (F) applied to the piezoelectric/electrostrictive portion is expressed by the following equation (2).

$$F \propto Y \times (\alpha_1 - \alpha_2) \qquad (2)$$

wherein F denotes the stress applied to the piezoelectric/electrostrictive portion, Y denotes the elastic constant of the piezoelectric/electrostrictive portion, $\alpha_1$ denotes the thermal expansion coefficient of the piezoelectric/electrostrictive portion, and $\alpha_2$ denotes the thermal expansion coefficient of the substrate.

The elastic constant of the piezoelectric/electrostrictive portion can be calculated from elastic compliance according to Standard of Electronic Materials Manufacturers Association of Japan "EMAS-6100."

When "x" in the general formula (1) is in the range of 0.02 to 0.05, in a piezoelectric/electrostrictive film sensor including a membranous piezoelectric/electrostrictive portion formed on a substrate, the absolute values of positive coercive electric field ($Ec^+$) and negative coercive electric field ($Ec^-$) applied to the piezoelectric/electrostrictive portion increase. Hence, a highly sensitive piezoelectric/electrostrictive film sensor can be manufactured. In other words, when "x" in the general formula (1) is in the range of 0.02 to 0.05, a material forming a piezoelectric/electrostrictive portion particularly in a sensor can have improved characteristics. From the viewpoint of further improving the characteristics of a sensor, "x" in the general formula (1) is preferably in the range of 0.02 to 0.03. When "x" is less than 0.02, a large tensile stress occurs on the surface of the piezoelectric/electrostrictive portion, possibly causing a crack. When "x" is more than 0.05, in a piezoelectric/electrostrictive film sensor, the absolute values of positive coercive electric field ($Ec^+$) and negative coercive electric field ($Ec^-$) applied to the piezoelectric/electrostrictive portion decrease. The piezoelectric/electrostrictive film sensor may therefore have lower detectivity.

When "x" in the general formula (1) satisfies $0.04 \leq x < 0.08$, in a piezoelectric/electrostrictive film actuator including a membranous piezoelectric/electrostrictive portion formed on a substrate, the piezoelectric constant of the piezoelectric/electrostrictive portion increases. Thus, an inverse piezoelectric effect in combination with the application of stress increases the displacement. Hence, the piezoelectric/electrostrictive film actuator thus manufactured can have a large displacement. In other words, when "x" in the general formula (1) satisfies $0.04 \leq x < 0.08$, a material forming a piezoelectric/electrostrictive portion particularly in an actuator can have improved characteristics. From the viewpoint of further improving the characteristics of an actuator, "x" in the general formula (1) is preferably in the range of 0.04 to 0.06.

When "a" in the general formula (1) is 0.5 or more, the ratio of Bi to Ti exceeds its stoichiometric ratio (a=0.5). When the ratio of Bi to Ti is larger than the stoichiometric ratio, a secondary phase having a smaller insulation resistance may be generated at a grain boundary during firing. This may cause leakage. Thus, in a piezoelectric/electrostrictive material according to the present invention, where "a" in the general formula (1) is less than 0.5, a secondary phase is hardly generated during firing. Hence, a piezoelectric/electrostrictive material according to the present invention can provide a piezoelectric/electrostrictive body or a piezoelectric/electrostrictive element each having excellent piezoelectric/electrostrictive characteristics. "a" is preferably in the range of 0.47 to 0.49 and more preferably in the range of 0.48 to 0.49.

When "a/b" in the general formula (1) is less than 1.01, a product such as a piezoelectric/electrostrictive body has a decreased density and contains crystal grains having an increased particle size. Thus, the product may have poor piezoelectric/electrostrictive characteristics. When "a/b" is more than 1.08, dielectric breakdown may occur during polarization. Dielectric breakdown may make the piezoelectric/electrostrictive ceramic unusable.

When "(a+b)/c" in the general formula (1) is less than 0.92, the particle size of crystal grains of a product, such as a piezoelectric/electrostrictive body, formed of the material can be decreased. The product can therefore have an increased strength, but may have a lower density and poorer piezoelectric/electrostrictive characteristics. When "(a+b)/c" is 0.99 or more, a product such as a piezoelectric/electrostrictive body has a decreased density and contains crystal grains having an increased particle size. Thus, the product may have poor piezoelectric/electrostrictive characteristics. "(a+b)/c" is preferably in the range of 0.92 to 0.96 and more preferably in the range of 0.94 to 0.95.

When "c" in the general formula (1) is less than 0.9, a Nb-based hetero-phase is separated from the material and thereby greatly inhibits the grain growth, causing deterioration in characteristics. When "c" is more than 1.1, leaching of an excessive amount of readily ionizable K or Na may greatly decrease the insulation resistance of the material. "c" is preferably in the range of 0.95 to 1.05 and more preferably in the range of 0.95 to 1.00.

In the general formula (1), $\zeta \neq 0$ when $\delta = 0$ and $\delta \neq 0$ when $\zeta = 0$. In other words, in the general formula (1), either "$\delta$" or "$\zeta$" is not "0". In a piezoelectric/electrostrictive material according to the present invention under this condition, abnormal grain growth is more greatly inhibited. Thus, a piezoelectric/electrostrictive body or a piezoelectric/electrostrictive portion each formed of a piezoelectric/electrostrictive material according to the present invention can have excellent insulation characteristics or high mechanical strength.

A method for manufacturing a piezoelectric/electrostrictive material according to an embodiment of the present invention will now be described. First, metallic elements constituting the piezoelectric/electrostrictive material, oxides or carbonates thereof, or compounds containing a plurality of these elements are mixed in amounts such that the elements satisfy the molar ratio of the composition represented by the general formula (1). Mixing may be performed by a conventional method, for example, in a ball mill. Specifically, predetermined amounts of raw materials, balls, and water are mixed for a predetermined time in a ball mill to prepare mixed slurry. Subsequently, the mixed slurry may be dried by evaporation or filtration to prepare a raw material mixture.

The raw material mixture may be calcined to yield a piezoelectric/electrostrictive material having a nonstoichiometric composition represented by a general formula (1). Calcination may be performed in the air or in an oxygen atmosphere. In the diffraction intensity of the piezoelectric/electrostrictive material measured with an X-ray diffractometer, the ratio of the intensity of the strongest diffracted ray in a phase other than a perovskite phase to the intensity of the strongest diffracted ray in the perovskite phase is preferably 5% or less and more preferably 2% or less.

The piezoelectric/electrostrictive material may be pulverized in a common pulverizer, such as a ball mill, an attritor, or a bead mill, to produce a particulate (or powdered) piezoelectric/electrostrictive material. The particulate piezoelectric/electrostrictive material has an average particle size preferably in the range of 0.1 to 1.0 μm and more preferably in the range of 0.2 to 0.7 μm. The particle size may preferably be controlled by heating the powdered piezoelectric/electrostrictive material at a predetermined temperature. Finer particles tend to agglomerate together to form larger particles. The powdered piezoelectric/electrostrictive material can therefore have a more uniform particle size distribution. This results in a piezoelectric/electrostrictive body or a piezoelectric/electrostrictive portion each having a more uniform particle size distribution. The piezoelectric/electrostrictive material may also be produced by an alkoxide method or a coprecipitation method.

2. Piezoelectric/Electrostrictive Body

A piezoelectric/electrostrictive body according to an embodiment of the present invention is formed of the piezoelectric/electrostrictive material described above. In other words, a piezoelectric/electrostrictive body according to the present invention is formed of a piezoelectric/electrostrictive material having a nonstoichiometric composition represented by a general formula (1). As described above, a piezoelectric/electrostrictive material as one aspect of the present invention can provide a piezoelectric/electrostrictive body having excellent piezoelectric/electrostrictive characteristics. Thus, a piezoelectric/electrostrictive body according to the present invention formed by calcination of the piezoelectric/electrostrictive material is free from Pb, is ecologically friendly, and has excellent piezoelectric/electrostrictive characteristics.

A piezoelectric/electrostrictive body according to the present invention is composed of many crystal grains having an average particle size of 7 μm or less, preferably in the range of 1 to 5 μm, and more preferably in the range of 1 to 3 μm. Crystal grains having an average particle size of more than 7 μm may decrease the strength of the piezoelectric/electrostrictive body. A piezoelectric/electrostrictive body according to the present invention may have any shape. A piezoelectric/electrostrictive body according to the present invention may preferably be a block (or bulk) or a sheet. Because PZT compositions have high dielectric constants, PZT sheets have large capacities. In contrast, because a piezoelectric/electrostrictive material according to the present invention has a low dielectric constant, a sheet-like piezoelectric/electrostrictive body formed of the piezoelectric/electrostrictive material has a capacity smaller than that of a sheet-like piezoelectric/electrostrictive body formed of a PZT composition. Thus, a sheet-like piezoelectric/electrostrictive body according to the present invention exhibits an excellent power saving effect.

A method for manufacturing a piezoelectric/electrostrictive body according to an embodiment of the present invention will now be described. First, a powdered piezoelectric/electrostrictive material is pressed into a green compact having a desired size. The green compact is fired at a temperature in the range of 800° C. to 1300° C. for one minute to 10 hours to produce a fired product having a predetermined shape. The fired product is then cut into pieces having an appropriate size. Electrodes are formed on each of the pieces. After poling, a piezoelectric/electrostrictive body (bulk) is produced.

A sheet-like piezoelectric/electrostrictive body may be formed in the following manner. A piezoelectric/electrostrictive material, a plasticizer, a dispersing agent, and a solvent are mixed in a mixing apparatus such as a ball mill to produce slurry. The slurry is formed into a sheet with a sheet forming machine such as a doctor blade.

3. Piezoelectric/Electrostrictive Element

Figure 1:
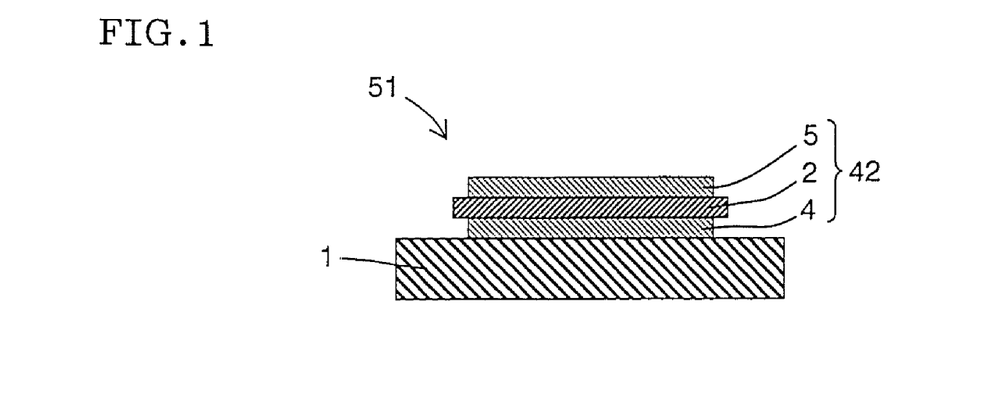
FIG. 1 is a cross-sectional view of a piezoelectric/electrostrictive element according to an embodiment of the present invention.

FIG. 1 is a cross-sectional view of a piezoelectric/electrostrictive element according to an embodiment of the present invention. As illustrated in FIG. 1, the piezoelectric/electrostrictive element 51 according to the present embodiment includes a ceramic substrate 1 and a piezoelectric/electrostrictive drive 42 disposed on the substrate 1. The piezoelectric/electrostrictive drive 42 includes a membranous piezoelectric/electrostrictive portion 2 and membranous electrodes 4 and 5 electrically connected to the piezoelectric/electrostrictive portion 2. The piezoelectric/electrostrictive portion 2 is fixed on the electrode 4 disposed on the substrate 1, so that the piezoelectric/electrostrictive drive 42 is disposed on the substrate 1. The piezoelectric/electrostrictive portion 2 may directly be disposed on the substrate 1. The term "fixed" used herein means that the piezoelectric/electrostrictive portion 2 is in intimate contact with the substrate 1 or the electrode 4 by a solid phase reaction without using any organic or inorganic adhesives.

The piezoelectric/electrostrictive portion 2 of the piezoelectric/electrostrictive element 51 according to the present embodiment is formed of the piezoelectric/electrostrictive material described above. In other words, the piezoelectric/electrostrictive portion 2 of the piezoelectric/electrostrictive element 51 according to the present embodiment is formed of a piezoelectric/electrostrictive material having a nonstoichiometric composition represented by a general formula (1). Thus, the piezoelectric/electrostrictive element 51 according to the present embodiment includes the piezoelectric/electrostrictive portion 2 having excellent piezoelectric/electrostrictive characteristics.

As illustrated in FIG. 1, a coercive electric field generated by the application of stress to an element including the membranous piezoelectric/electrostrictive portion 2 and the membranous electrodes 4 and 5 (piezoelectric/electrostrictive film element) is smaller than a coercive electric field in a bulk element. The piezoelectric/electrostrictive element 51 according to the present embodiment can therefore be polarized by the application of a lower electric field. Hence, the piezoelectric/electrostrictive element 51 has an excellent power saving effect.

Figure 3:
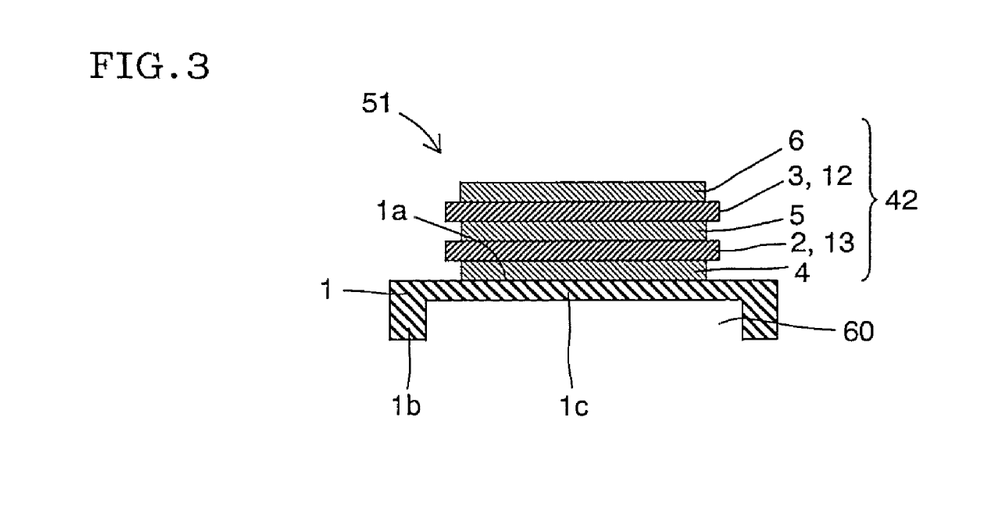
FIG. 3 is a cross-sectional view of a piezoelectric/electrostrictive element according to still another embodiment of the present invention.

As illustrated in FIG. 3, a piezoelectric/electrostrictive drive 42 including a plurality of piezoelectric/electrostrictive portions 2 and 3, and a plurality of electrodes 4, 5, and 6 is also preferred. The piezoelectric/electrostrictive portions 2 and 3 and the electrodes 4, 5, and 6 are alternately stacked such that each of the piezoelectric/electrostrictive portions 2 and 3 is sandwiched between corresponding pair of the electrodes 4, 5, and 6. The piezoelectric/electrostrictive drive 42 has a multilayer structure and can exhibit a large bending displacement by the application of a low voltage.

In the piezoelectric/electrostrictive element 51 according to the present embodiment (see FIG. 1), the piezoelectric/electrostrictive portion 2 has a thickness preferably in the range of 0.5 to 50 μm, more preferably in the range of 0.8 to 40 μm, and most preferably in the range of 1.0 to 30 μm. When the thickness of the piezoelectric/electrostrictive portion 2 is less than 0.5 μm, a piezoelectric/electrostrictive portion even formed of a piezoelectric/electrostrictive material according to the present invention may have an insufficient density. When the thickness of the piezoelectric/electrostrictive portion 2 is more than 50 μm, the piezoelectric/electrostrictive material has a larger contraction stress during firing. Thus, the thickness of the substrate 1 must be increased to prevent the destruction of the substrate 1. It may therefore be difficult to comply with the miniaturization of the element. In the multilayer piezoelectric/electrostrictive drive 42 illustrated in FIG. 3, the thickness of the piezoelectric/electrostrictive portions 2 and 3 means each thickness of the piezoelectric/electrostrictive portions 2 and 3.

While the substrate 1 is made of ceramic, the ceramic may be of any type. Preferably, in terms of heat resistance, chemical stability, and insulating properties, the ceramic contains at least one selected from the group consisting of stabilized zirconium oxide (zirconia), aluminum oxide, magnesium oxide, mullite, aluminum nitride, silicon nitride, and glass. Among them, stabilized zirconium oxide (zirconia) is more preferred because of its high mechanical strength and high toughness. The term "stabilized zirconium oxide" used herein means zirconium oxide in which phase transition of crystals is reduced by the addition of a stabilizer and includes partially stabilized zirconium oxide.

Examples of stabilized zirconium oxide include zirconium oxide containing 1% to 30% by mol of calcium oxide, magnesium oxide, yttrium oxide, scandium oxide, ytterbium oxide, cerium oxide, or rare-earth metal oxide, as a stabilizer. Among them, zirconium oxide containing yttrium oxide as a stabilizer is preferred because of its high mechanical strength as a diaphragm. The content of yttrium oxide is preferably in the range of 1.5% to 6% by mol and more preferably in the range of 2% to 4% by mol. Preferably, zirconium oxide further contains 0.1% to 5% by mol of aluminum oxide. While the crystal phase of stabilized zirconium oxide may be a mixed phase of cubic crystal+monoclinic crystal, a mixed phase of tetragonal crystal+monoclinic crystal, or a mixed phase of cubic crystal+tetragonal crystal+monoclinic crystal, a crystal phase principally composed of tetragonal crystal or of a mixed phase of tetragonal crystal+cubic crystal is preferred in terms of strength, toughness, and durability.

The thickness of the substrate 1 is preferably in the range of 1 μm to 1 mm, more preferably in the range of 1.5 to 500 μm, and most preferably in the range of 2 to 200 μm. When the thickness of the substrate 1 is less than 1 μm, the mechanical strength of the piezoelectric/electrostrictive element may be decreased. When the thickness of the substrate 1 is more than 1 mm, the rigidity of the substrate 1 against the contraction stress generated by the application of voltage to the piezoelectric/electrostrictive portion increases. This may decrease the bending displacement of the piezoelectric/electrostrictive portion.

Figure 2:
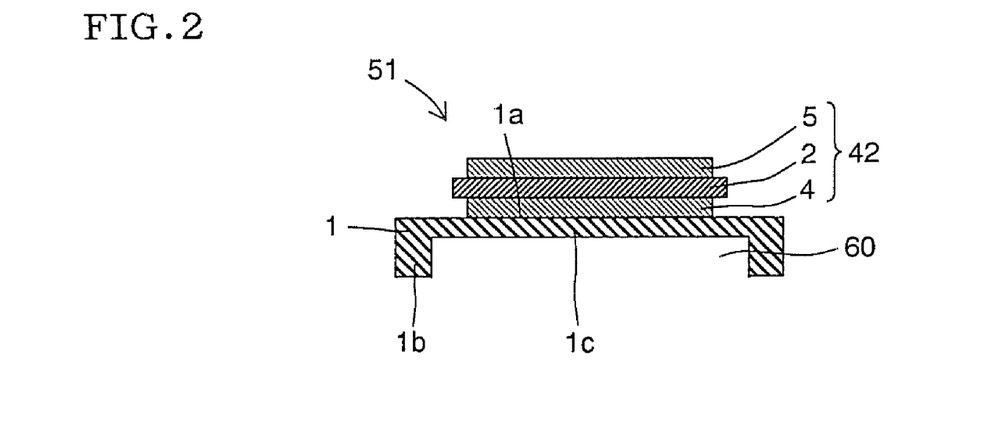
FIG. 2 is a cross-sectional view of a piezoelectric/electrostrictive element according to another embodiment of the present invention.
Figure 4:
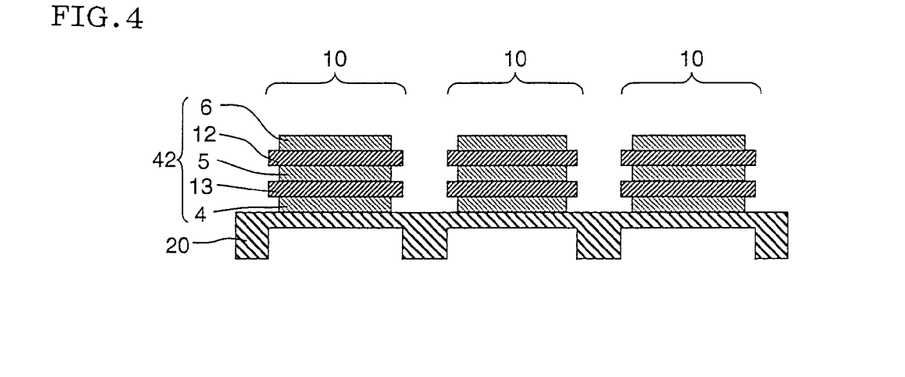
FIG. 4 is a cross-sectional view of a piezoelectric/electrostrictive element according to still another embodiment of the present invention.

The substrate 1 may have a shape as illustrated in FIG. 2. Specifically, the substrate 1 includes a thin diaphragm portion 1c and a thick portion 1b disposed around the diaphragm portion 1c. The diaphragm portion 1c has an adherend surface 1a. The thin diaphragm portion 1c has a thickness as described above. The thick portion 1b has a thickness larger than that of the diaphragm portion 1c. The diaphragm portion 1c and the thick portion 1b form a cavity 60, which communicates with the outside of the substrate 1. The electrode 4 (or piezoelectric/electrostrictive portion) is fixed on the adherend surface 1a. In other words, the piezoelectric/electrostrictive drive 42 is disposed on a surface (adherend surface 1a) of the diaphragm portion 1c opposite the cavity 60. A substrate 1 having such a structure can provide a piezoelectric/electrostrictive element exhibiting a large bending displacement and high mechanical strength. A piezoelectric/electrostrictive element according to another embodiment can have a structure as illustrated in FIG. 4. A common substrate 20 includes a series of substrates 1 as illustrated in FIG. 2. A plurality of piezoelectric/electrostrictive element units 10 (piezoelectric/electrostrictive drives 42) each including a first piezoelectric/electrostrictive portion 12, a second piezoelectric/electrostrictive portion 13, and electrodes 4, 5, and 6 are disposed on the common substrate 20.

In the piezoelectric/electrostrictive element 51 including the substrate 1 as illustrated in FIG. 2, the diaphragm portion 1c can vibrate in synchronization with the movement of the piezoelectric/electrostrictive drive 42. The piezoelectric/electrostrictive element 51 can therefore be used as a sensor. Use of a piezoelectric/electrostrictive element according to the present invention as a sensor will be described in detail later.

The shape of the surface (surface on which the electrode 4 is fixed in FIG. 1) of a substrate in a piezoelectric/electrostrictive element according to the present invention may be, but not limited to, rectangular, square, triangular, elliptical, perfect circular, round-edged square, round-edged rectangular, or a combined shape thereof. The entire substrate may be, but not limited to, a capsule having a cavity therein.

In a piezoelectric/electrostrictive element according to the present invention, electrodes are electrically connected to a piezoelectric/electrostrictive portion. Preferably, the piezoelectric/electrostrictive portion is disposed between the electrodes. The electrodes are preferably disposed to include a bending displacement region of the piezoelectric/electrostrictive portion. For example, referring to FIG. 3, electrodes 4, 5, and 6 preferably cover at least 80% of each surface area of a first piezoelectric/electrostrictive portion 12 and a second piezoelectric/electrostrictive portion 13, including the central part thereof.

In a piezoelectric/electrostrictive element according to the present invention, the electrodes may be composed of at least one metal selected from the group consisting of Pt, Pd, Rh, Au, Ag, Ir, and alloys thereof. Among them, Pt or Pt alloys are preferred because of their high heat resistance in firing a piezoelectric/electrostrictive portion.

The thickness of the electrodes is preferably 15 μm or less and more preferably 5 μm or less. The electrodes having a thickness of more than 15 μm may act as a relaxation layer, thus decreasing the bending displacement. The electrodes may have a thickness of at least 0.05 μm to function as an electrode.

A method for manufacturing a piezoelectric/electrostrictive element according to an embodiment of the present invention will now be described. First, a piezoelectric/electrostrictive material layer is formed on a ceramic substrate or on a first electrode formed on a substrate. The first electrode may be formed by ion beam sputtering, vacuum evaporation, physical vapor deposition (PVD), ion plating, chemical vapor deposition (CVD), plating, screen printing, spraying, or dipping. Preferably, the first electrode is formed by sputtering or screen printing in terms of connection between the first electrode and the substrate and between the first electrode and a piezoelectric/electrostrictive portion. The first electrode thus formed may be fired (heat treatment) at a temperature in the range of 600° C. to 1400° C. to be combined with the substrate and/or the piezoelectric/electrostrictive portion into one unit. Firing may be performed subsequently to the formation of each individual electrode or simultaneously with the heat treatment of the piezoelectric/electrostrictive material layer.

The piezoelectric/electrostrictive material layer may be formed on a substrate by ion beam sputtering, vacuum evaporation, PVD, ion plating, CVD, plating, a sol-gel method, aerosol deposition, screen printing, spraying, or dipping. Among them, screen printing is preferred because a piezoelectric/electrostrictive material layer having a precise shape and a precise thickness can continuously be formed without difficulty. Then, a second electrode may be formed on the piezoelectric/electrostrictive material layer by the same method as described above. Piezoelectric/electrostrictive material layers and electrodes may alternately be stacked on this electrode to form a desired multilayer product.

The multilayer product is then fired to fix the piezoelectric/electrostrictive portion onto the substrate directly or via the first electrode. The piezoelectric/electrostrictive portion is composed of crystal grains of the piezoelectric/electrostrictive material. Firing may be performed subsequently to the formation of each individual piezoelectric/electrostrictive material layer. Preferably, firing is performed simultaneously with the heat treatment of the electrodes in terms of production efficiency.

The firing temperature may preferably be in the range of 950° C. to 1100° C., more preferably in the range of 975° C. to 1050° C., and most preferably in the range of 1000° C. to 1050° C. The firing temperature below 950° C. may result in insufficient fixation of the piezoelectric/electrostrictive portion on the substrate or the first electrode, or an insufficient density of the piezoelectric/electrostrictive portion. The firing temperature over 1100° C. may make it difficult to use electrodes having relatively low heat resistance, such as Ag electrodes or Ag—Pd electrodes. The duration of the maximum temperature in firing is preferably in the range of one minute to 10 hours and more preferably in the range of five minutes to four hours. The duration of the maximum temperature below one minute may result in an insufficient density of the piezoelectric/electrostrictive portion. The duration of the maximum temperature over 10 hours may increase the total amount of vaporized elements in the piezoelectric/electrostrictive material, such as Bi and K, even when the firing atmosphere is controlled. This may cause failure, for example, poor piezoelectric/electrostrictive characteristics or frequent dielectric breakdown.

The fired product is then polarized under appropriate conditions. As in conventional methods, poling is preferably performed while a specimen is heated. The heating temperature is preferably in the range of 40° C. to 200° C. depending on the Curie point of a piezoelectric/electrostrictive ceramic.

A sheet-like piezoelectric/electrostrictive portion may be formed in the following manner. A piezoelectric/electrostrictive material, a plasticizer, a dispersing agent, and a solvent are mixed in a mixing apparatus such as a ball mill to produce slurry. The slurry is formed into a sheet with a sheet forming machine such as a doctor blade.

A conductive film (electroconductive material-based film) having a predetermined pattern is formed on the sheet-like piezoelectric/electrostrictive portion to form an electrode, for example, by screen printing. Piezoelectric/electrostrictive material layers and electrodes are alternately stacked and pressed to form a green ceramic laminate having a predetermined thickness. Punched sheets may be stacked to form a cell structure. The green ceramic laminate can be fired to produce a fired laminate. Use of the cell structure may provide a cell-driving piezoelectric/electrostrictive element. Firing may be performed subsequently to the formation of each individual piezoelectric/electrostrictive material layer. Preferably, firing is performed simultaneously with the heat treatment of the electrodes in terms of production efficiency.

Figure 5:
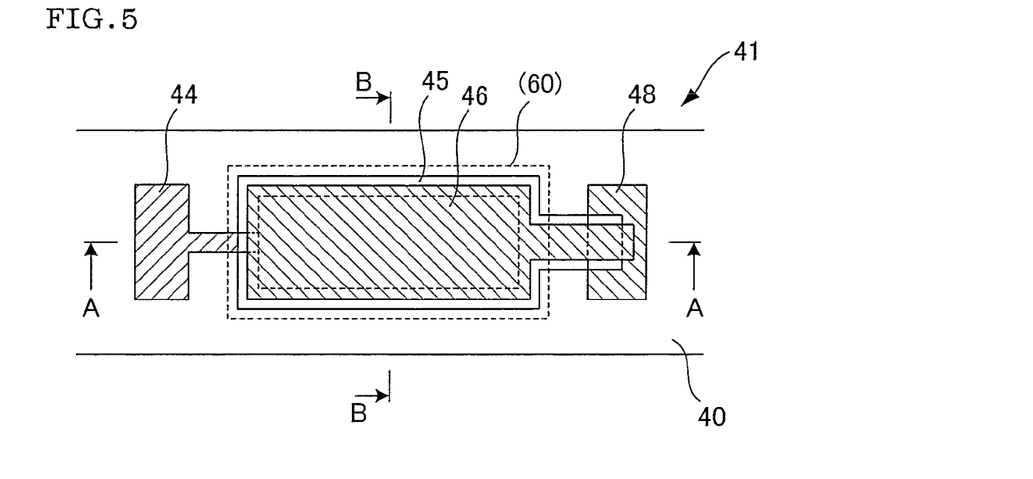
FIG. 5 is a plan view of a sensor including a piezoelectric/electrostrictive element according to an embodiment of the present invention.
Figure 6:
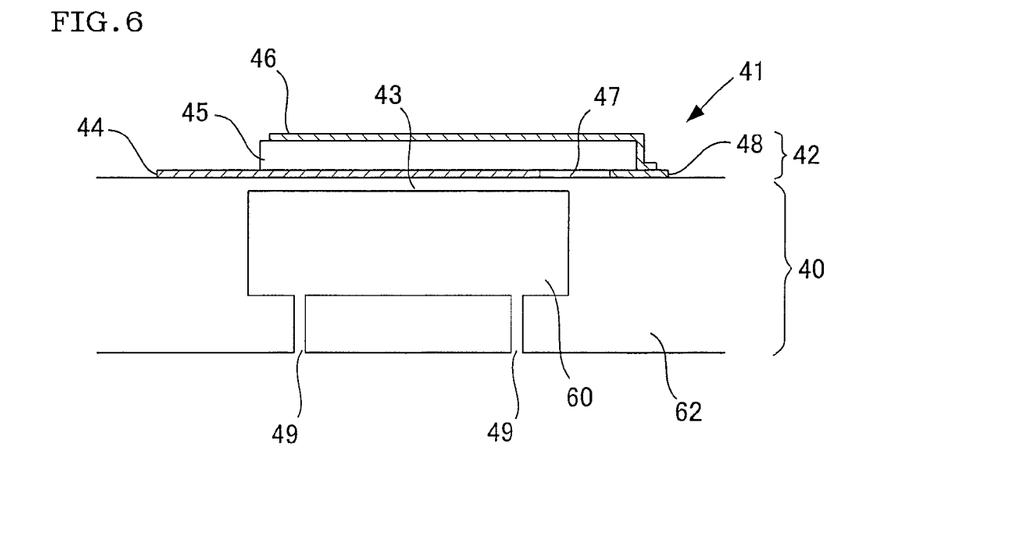
FIG. 6 is a cross-sectional view taken along the line A-A of FIG. 5.
Figure 7:
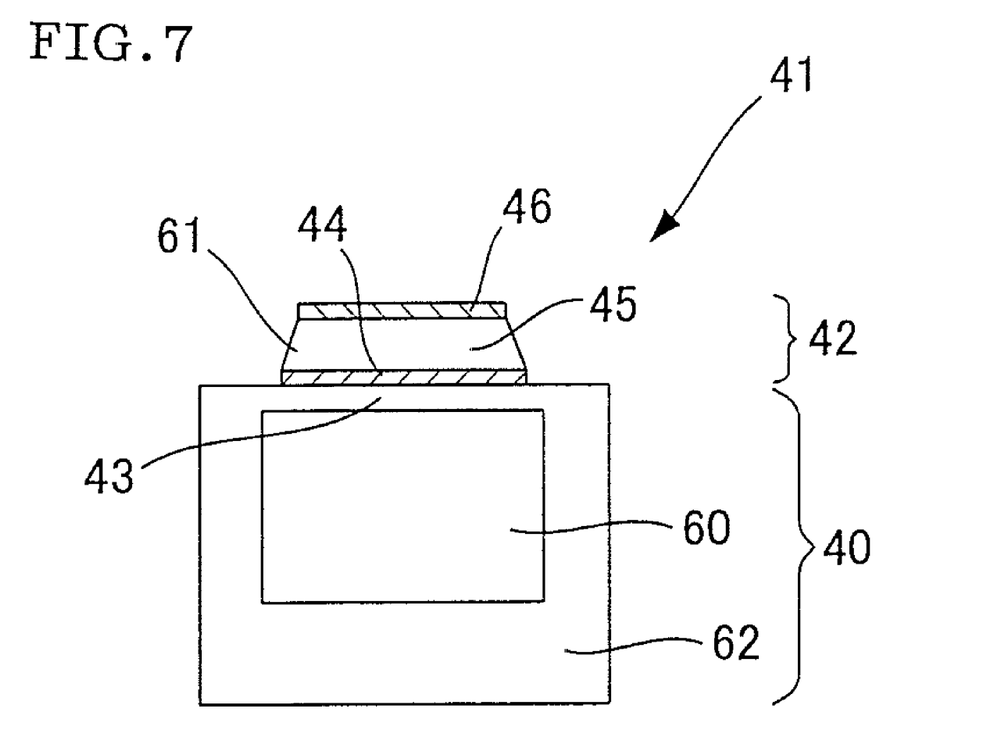
FIG. 7 is a cross-sectional view taken along the line B-B of FIG. 5.

FIG. 5 is a plan view of a sensor including a piezoelectric/electrostrictive element according to an embodiment of the present invention. FIG. 6 is a cross-sectional view taken along the line A-A of FIG. 5. FIG. 7 is a cross-sectional view taken along the line B-B of FIG. 5. As illustrated in FIGS. 5 to 7, a piezoelectric/electrostrictive element (piezoelectric/electrostrictive film sensor 41) according to the present embodiment includes a zirconia substrate 40 and a piezoelectric/electrostrictive drive 42. The substrate 40 includes a thin diaphragm portion 43 and a thick portion 62 disposed around the diaphragm portion 43. The diaphragm portion 43 and the thick portion 62 form a cavity 60 communicating with the outside of the substrate 40 via a through-hole 49. The piezoelectric/electrostrictive drive 42 is disposed on the diaphragm portion 43 of the substrate 40. The piezoelectric/electrostrictive drive 42 has a layered structure of a membranous piezoelectric/electrostrictive portion 45 and a pair of membranous electrodes (first electrode 44 and second electrode 46) sandwiching the piezoelectric/electrostrictive portion 45.

One end of the first electrode 44 on the side of an auxiliary electrode 48 is located closer to the center of the diaphragm portion 43 than the corresponding end of the diaphragm portion 43. The auxiliary electrode 48 underlies the piezoelectric/electrostrictive portion 45 and is isolated from the first electrode 44 by an incomplete bonding portion 47. One end of the first electrode 44 and the auxiliary electrode 48 disposed on the thick portion 62 serve as lead terminals. A layer for binding the piezoelectric/electrostrictive portion 45 to the diaphragm portion 43 may be formed at the incomplete bonding portion 47 (between the first electrode 44 and the auxiliary electrode 48). The piezoelectric/electrostrictive portion 45 is formed across the first electrode 44 and the auxiliary electrode 48. The second electrode 46 is formed across the piezoelectric/electrostrictive portion 45 and the auxiliary electrode 48. The second electrode 46 is electrically connected to the auxiliary electrode 48. The piezoelectric/electrostrictive portion 45 has flared portions 61. However, when fluctuations or time-dependent changes in electric constant must be reduced, the piezoelectric/electrostrictive portion 45 may have almost the same size as the first electrode 44 and no flared portion 61.

The diaphragm portion 43 vibrates in synchronization with the movement of the piezoelectric/electrostrictive drive 42 in the piezoelectric/electrostrictive film sensor 41. The thickness of the diaphragm portion 43 is generally 50 μm or less, preferably 30 μm or less, and more preferably 15 μm or less so as not to hinder the vibration of the piezoelectric/electrostrictive portion 45. The planar shape of the diaphragm portion 43 may be rectangular, square, triangular, elliptical, or perfect circular. In a sensor in which the resonant mode to be excited must be simplified, the planar shape of the diaphragm portion 43 is preferably rectangular or perfect circular.

In general, when the D-E curve of a piezoelectric/electrostrictive film sensor is measured with a Sawyer-Tower circuit, remanent polarization (2Pr) changes with operating conditions (flow rate in a fluid sensor or pressure in a pressure sensor). A piezoelectric/electrostrictive film sensor utilizes such a change in remanent polarization. In general piezoelectric/electrostrictive film sensors, D-E curves are asymmetrical. In an asymmetrical D-E curve, the electric displacement (P) is measured in an electric field of $\{(Ec^+)+(Ec^-)\}/2$. In the presence of variations in the symmetry of the D-E curve, the electric displacement (P) in an electric field of $\{(Ec^+)+(Ec^-)\}/2$ must be measured with a correction circuit every time sensing is performed. In the absence of variations in the symmetry of the D-E curve, no correction circuit is required. Sensing can therefore be performed at a higher speed. When a piezoelectric/electrostrictive film sensor is operated at no load (zero flow rate in a fluid sensor or zero pressure in a pressure sensor), an asymmetric $|Ec^+|/|Ec^-|$ parameter can be utilized for quality control. Specifically, when a piezoelectric/electrostrictive film sensor is scanned at a bipolar driving frequency in the range of 1 to 100 Hz, a smaller degree of variability in $|Ec^+|/|Ec^-|$ is indicative of a more stable sensor.

The degree of variability can be calculated by the following equation (3).

Degree of variability(%)=(maximum deviation/average variation)×100  (3)

In the piezoelectric/electrostrictive film sensor 41 illustrated in FIG. 5, the effective area of the first electrode 44 is 0.45 to 0.5 times the area of a two-dimensional image of the cavity 60 projected on the substrate 40. The ratio ($t_p/t_d$) of the thickness ($t_p$) of the piezoelectric/electrostrictive portion 45 to the thickness ($t_d$) of the diaphragm portion 43 is in the range of 1 to 1.5. The degree of variability of the ratio ($|Ec^+|/|Ec^-|$) of a positive coercive electric field ($Ec^+$) to a negative coercive electric field ($Ec^-$) at a bipolar driving frequency in the range of 1 to 100 Hz is 10% or less. Accordingly, the piezoelectric/electrostrictive film sensor 41 according to the present embodiment can perform very stable sensing. To provide a more stable sensor, the degree of variability is preferably in the range of 0% to 8% and more preferably in the range of 0% to 6%, while the ratio of the effective area of the first electrode 44 to the two-dimensional image of the cavity 60 and the ratio ($t_p/t_d$) are within the same range.

A piezoelectric/electrostrictive element according to the present invention can be used not only as a sensor, but also as an actuator. Hitherto, a residual strain of a piezoelectric/electrostrictive portion increased by poling has been reduced by stress relaxation. In contrast, a large compressive stress in the thickness direction can be applied to a piezoelectric/electrostrictive element according to the present invention, which includes a membranous piezoelectric/electrostrictive portion formed of the piezoelectric/electrostrictive material described above. In other words, in a piezoelectric/electrostrictive element according to the present invention, the compressive stress reduces the residual strain of the piezoelectric/electrostrictive portion. Thus, a piezoelectric/electrostrictive element according to the present invention can generate a larger displacement than existing piezoelectric/electrostrictive elements. More specifically, when the piezoelectric/electrostrictive portion is fixed on an electrode formed on a substrate, the effective area of the electrode is 0.45 to 0.5 times the area of a two-dimensional image of a cavity projected on the substrate, the ratio ($t_p/t_d$) of the thickness ($t_p$) of the piezoelectric/electrostrictive portion to the thickness ($t_d$) of a diaphragm portion is in the range of 1 to 1.5, and the displacement of the diaphragm portion during unipolar driving is at least 0.2 µm, preferably at least 0.22 µm, and more preferably at least 0.24 µm.

Materials for components of a piezoelectric/electrostrictive element according to the present invention particularly used as a sensor are described below with reference to the piezoelectric/electrostrictive film sensor 41 illustrated in FIGS. 5 to 7. The material of the substrate 40 preferably has heat resistance, chemical stability, and insulating properties. This is because the first electrode 44, the piezoelectric/electrostrictive portion 45, and the second electrode 46 may be heat-treated into a single unit. This is also because the piezoelectric/electrostrictive film sensor may be used for electrically conductive fluids or corrosive fluids. Examples of the material of the substrate 40 include stabilized zirconium oxide (zirconia), aluminum oxide, magnesium oxide, mullite, aluminum nitride, silicon nitride, and glass. Among them, stabilized zirconium oxide is most preferred because it can exhibit high mechanical strength and high toughness even when the diaphragm portion has a very small thickness. In addition, in a combination of zirconium oxide and the piezoelectric/electrostrictive material, the thermal expansion coefficient of zirconium oxide is smaller than that of the piezoelectric/electrostrictive material. Accordingly, a tensile stress resulting from difference in thermal expansion can be generated along the surface of the piezoelectric/electrostrictive portion 45 (compressive stress in the thickness direction) during cooling after firing. Thus, in a piezoelectric/electrostrictive material having a large residual strain in the polarization direction in the initial poling, this can effectively reduce the residual strain and improve the bending displacement.

The piezoelectric/electrostrictive portion 45 of the piezoelectric/electrostrictive film sensor 41 is formed of a piezoelectric/electrostrictive material having a nonstoichiometric composition represented by a general formula (1). Hence, the piezoelectric/electrostrictive film sensor 41 includes the piezoelectric/electrostrictive portion 45 having excellent piezoelectric/electrostrictive characteristics and high mechanical strength.

When a binding layer is provided between the piezoelectric/electrostrictive portion 45 and the substrate 40, the material of the binding layer may be an organic material or an inorganic material exhibiting high adhesiveness and strong bonding to both the piezoelectric/electrostrictive portion 45 and the substrate 40. The material of the binding layer preferably has a thermal expansion coefficient intermediate between that of the material of the substrate 1 and that of the material of the piezoelectric/electrostrictive portion 45 (piezoelectric/electrostrictive material) to achieve strong bonding. When the piezoelectric/electrostrictive portion 45 is heat-treated, the material of the binding layer is preferably a glass material having a softening point higher than the heat treatment temperature of the piezoelectric/electrostrictive portion 45. This is because the glass material can strongly bind the piezoelectric/electrostrictive portion 45 to the substrate 40 and is hardly deformed by heat treatment owing to its high softening point.

The materials of electrodes (first electrode 44, second electrode 46, and auxiliary electrode 48) may be gold, gold alloys, platinum, platinum alloys, silver, or silver alloys.

A method for manufacturing a piezoelectric/electrostrictive element according to the present invention particularly used as a sensor is described below, taking a method for manufacturing the piezoelectric/electrostrictive film sensor 41 illustrated in FIGS. 5 to 7 by way of example. The substrate 40 may be produced by green sheet lamination. Specifically, a predetermined number of ceramic green sheets are prepared. A required number of ceramic green sheets are punched, for example, with a punching machine provided with a punch and a die to form openings having a predetermined shape, which form the cavity 60 after lamination. A required number of ceramic green sheets are punched to form openings having a predetermined shape, which form the through-hole 49 after lamination. The ceramic green sheets having openings to form the through-hole 49, the ceramic green sheets having openings to form the cavity 60, and a ceramic green sheet to constitute the diaphragm portion 43 are stacked in this order to form a green laminate. The green laminate is fired to produce the substrate 40.

The ceramic green sheets can be produced by a known method for manufacturing a ceramic. For example, a ceramic powder, a binder, a solvent, a dispersing agent, and a plasticizer are mixed to produce slurry. After degassing, the slurry is formed into a ceramic green sheet by a sheet molding method, such as a doctor blade method, a reverse roll coater method, or a reverse doctor roll coater method.

The piezoelectric/electrostrictive drive 42 may be produced separately and then attached to the substrate 40. Alternatively, the piezoelectric/electrostrictive drive 42 may directly be formed on the substrate 40 as described below.

First, the first electrode 44 and the auxiliary electrode 48 are formed on the diaphragm portion 43 of the substrate 40 by a known film forming method. Examples of the film forming method include thin-film methods, such as ion beam sputtering, vacuum evaporation, CVD, ion plating, and plating, and thick-film forming methods, such as screen printing, spraying, and dipping. In particular, sputtering and screen printing are suitable.

The binding layer may be formed by a common thick-film forming method, such as stamping or screen printing. The binding layer having a thickness of several tens of micrometers to several hundreds of micrometers may preferably be formed by an ink-jet method. The binding layer may be heat-treated before the formation of the piezoelectric/electrostrictive portion 45. Alternatively, the binding layer may be heat-treated together with the piezoelectric/electrostrictive portion 45.

The piezoelectric/electrostrictive portion 45 may be formed by a known film forming method as in the first electrode 44 and the auxiliary electrode 48. Among others, screen printing is suitable because of its low cost. The piezoelectric/electrostrictive portion 45 may be heat-treated together with the first electrode 44, the auxiliary electrode 48, and the binding layer. The heat treatment temperature is in the range of 900° C. to 1400° C. The piezoelectric/electrostrictive portion 45 and the evaporation source of the piezoelectric/electrostrictive material may preferably be heated in a controlled atmosphere to prevent the piezoelectric/electrostrictive portion 45 from becoming unstable at high temperature.

The second electrode 46 may be formed by the same film forming method as in the first electrode 44 and the auxiliary electrode 48. After the film formation, the second electrode 46 may be heat-treated to be combined with the piezoelectric/electrostrictive portion 45 and the auxiliary electrode 48 into one unit.

The first electrode 44, the binding layer, the piezoelectric/electrostrictive portion 45, and second electrode 46 may sequentially be heat-treated subsequently to the formation of each component or may simultaneously be heat-treated after the formation of all the components. The heat treatment temperature is appropriately determined to achieve strong bonding and prevent deterioration caused by the diffusion of constituting elements.

These processes provide the piezoelectric/electrostrictive film sensor 41 including the substrate 40 and the piezoelectric/electrostrictive drive 42. Preferably, the entire piezoelectric/electrostrictive film sensor 41 or at least the piezoelectric/electrostrictive drive 42 is washed with an acid solution or pure water. This washing can remove sodium, potassium, and other impurities on the surface of the piezoelectric/electrostrictive portion 45. The removal of these impurities ensures the surface insulating properties of the piezoelectric/electrostrictive portion 45 even at high humidities.

The piezoelectric/electrostrictive portion 45 is polarized through the application of a direct current high voltage. In poling, a pulse voltage is preferably increased with the number of voltage pulses to increase the polarizability in a short time. This is probably because the piezoelectric/electrostrictive portion 45 is polarized while the internal stress of the piezoelectric/electrostrictive portion 45 is relieved. After poling, the piezoelectric/electrostrictive portion 45 is preferably heated (80° C. to 100° C.) to converge the electric constant of the piezoelectric/electrostrictive portion 45. After or upon the convergence, the piezoelectric/electrostrictive portion 45 is preferably polarized again. This can stabilize the characteristics of the piezoelectric/electrostrictive film sensor 41. The electric constant of the piezoelectric/electrostrictive portion 45 may be capacitance, loss factor, resistance, reactance, conductance, susceptance, or inductance.

EXAMPLES

The present invention will now be described more specifically in the following examples. However, the invention is not limited to the examples. Methods for evaluating physical properties and other characteristics are described below.

Composition analysis: A sintered compact (piezoelectric/electrostrictive body) was analyzed by a fluorescent X-ray method. The composition of the sintered compact was determined using a calibration curve.

Piezoelectric constant $d_{31}$: measured according to Standard of Electronic Materials Manufacturers Association of Japan "Electronic test methods for the characterization of piezoelectric ceramic oscillators EMAS-6100."

Density: determined by Archimedes' principle.

Crystal grain size: An average particle size was determined by a line intercept method. The "line intercept method" utilizes an image or a photograph of a microscope (for example, SEM, microscope, or laser microscope) to determine the crystal grain size in a simple manner. A line having a reference length as determined from the magnification or a scale on the image is drawn on the image or the photograph. The number of particles on the line is counted. The crystal grain size is calculated by the equation of "average particle size=reference length/number of particles." Alternatively, a line is drawn through a predetermined number of crystal grains. The crystal grain size is calculated by the equation of "average particle size=line length/number of particles." A more statistical average particle size can be determined by increasing the number of lines.

Elastic constant (Y): calculated from the elastic compliance according to "EMAS-6100."

Thermal expansion coefficient ($\alpha_1$): The thermal expansion coefficients of a piezoelectric/electrostrictive body (bulk) and a substrate were determined according to JIS R1618: 2002 "Measuring method of thermal expansion of fine ceramics by thermomechanical analysis."

Coercive electric field: Three pulses of ±8 kV/mm triangular waves were applied to a piezoelectric/electrostrictive element. A D-E hysteresis curve was obtained at the third pulse. A point of D=0 on the hysteresis curve on the positive electric field side was referred to as "positive coercive electric field $Ec^+$." A point of D=0 on the hysteresis curve on the negative electric field side was referred to as "negative coercive electric field $Ec^-$." The coercive electric field was calculated as a mean value $((|Ec^+|+|Ec^-|)/2)$.

Degree of variability: Three pulses of ±8 kV/mm triangular waves were applied to a piezoelectric/electrostrictive element. D-E hysteresis curves were obtained at the third pulse at a frequency of from 1 to 100 Hz in increments of 1 Hz. The ratios $|Ec^+|/|Ec^-|$ of absolute values of the positive coercive electric field and the negative coercive electric field were calculated for each D-E curve. A mean value of all the ratios and deviations were calculated. The degree of variability was calculated by the equation (3).

$$\text{Degree of variability}(\%)=(\text{maximum deviation/average variation})\times 100 \quad (3)$$

Bending displacement: A voltage was placed between a first electrode and a second electrode so that the electric field was 7.5 kV/mm. The bending displacement was measured with a laser displacement gage.

Examples 1 to 32 and Comparative Examples 1 to 20

Starting materials, bismuth oxide ($Bi_2O_3$), sodium hydrogen tartrate monohydrate ($NaHC_4H_4O_6 \cdot H_2O$), titanium oxide ($TiO_2$), potassium hydrogen tartrate ($KHC_4H_4O_6$), and niobium (V) oxide ($Nb_2O_5$) were fully dried. The starting materials were weighed so as to give the predetermined composition (see Tables 1 and 2). The starting materials were mixed in an ethanol solvent together with 2 mmϕ zirconia cobblestones for 16 hours. The resulting mixture was dried, was calcined at 900° C. in the air for two hours, and was wet-ground in a ball mill for two hours. The ground powder slurry was passed through a 420-mesh nylon sieve to remove unground particles and aggregates and was fully dried to produce a piezoelectric/electrostrictive material. The piezoelectric/electrostrictive material was pressed into 20 mmϕ pellets having a thickness of 10 mm. The pellets were fired at 1150° C. in the air for two hours. The sintered ceramic was processed into a ceramic having a length of 12 mm, a width of 3 mm, and a thickness of 1 mm. An electric field of 6 kV/mm was applied to the ceramic in a silicone oil in the thickness direction for 10 minutes to polarize the ceramic, thus producing a piezoelectric/electrostrictive body (Examples 1 to 32 and Comparative Examples 1 to 20). Tables 1 and 2 show the composition ("x", "a/b", "a+b", "c", "a", "δ", and "ζ"), the piezoelectric constant $d_{31}$ (pm/V), the density (g/cm³), the crystal grain size (μm), "$Y\alpha_1$" (kPa/K), and the coercive electric field (kV/mm) of the piezoelectric/electrostrictive body (Examples 1 to 32 and Comparative Example 1 to 20).

TABLE 1

| | x | a/b | a + b | c | a | δ | ζ | Piezoelectric constant $d_{31}$ (pm/V) | Density (g/cm³) | Crystal grain size (μm) | $Y\alpha_1$ (kPa/K) | Coercive electric field (kV/mm) |
|---|---|---|---|---|---|---|---|---|---|---|---|---|
| Example 1 | 0.02 | 1.01 | 0.99 | 1 | 0.4975 | −0.01 | 0.00 | 23 | 5.7 | 5 | 16.45 | 4.9 |
| Example 2 | 0.02 | 1.04 | 0.98 | 1 | 0.4996 | −0.01 | 0.00 | 23 | 5.75 | 5 | 16.7 | 4.7 |
| Example 3 | 0.02 | 1.04 | 0.97 | 1 | 0.4945 | −0.02 | 0.00 | 23 | 5.79 | 3 | 16.7 | 4.7 |
| Example 4 | 0.02 | 1.01 | 0.96 | 1 | 0.4824 | −0.04 | 0.00 | 23 | 5.81 | 2 | 16.45 | 4.5 |
| Example 5 | 0.02 | 1.04 | 0.96 | 1 | 0.4894 | −0.03 | 0.00 | 23 | 5.85 | 3 | 16.65 | 4.6 |
| Example 6 | 0.02 | 1.04 | 0.95 | 1 | 0.4843 | −0.04 | 0.00 | 25 | 5.87 | 2 | 16.45 | 4.4 |
| Example 7 | 0.02 | 1.01 | 0.94 | 1 | 0.4723 | −0.06 | 0.00 | 23 | 5.82 | 3 | 17.7 | 4.2 |
| Example 8 | 0.02 | 1.02 | 0.94 | 1 | 0.4747 | −0.06 | 0.00 | 23 | 5.86 | 2 | 16.65 | 4.3 |
| Example 9 | 0.02 | 1.04 | 0.94 | 1 | 0.4792 | −0.05 | 0.00 | 28 | 5.92 | 2 | 16.2 | 4.9 |
| Example 10 | 0.02 | 1.06 | 0.94 | 1 | 0.4837 | −0.05 | 0.00 | 28 | 5.91 | 1 | 16 | 4.5 |
| Example 11 | 0.02 | 1.08 | 0.94 | 1 | 0.4881 | −0.04 | 0.00 | 28 | 5.9 | 1 | 17.1 | 4 |
| Example 12 | 0.02 | 1.04 | 0.93 | 1 | 0.4741 | −0.06 | 0.00 | 23 | 5.84 | 1 | 17.55 | 4.7 |
| Example 13 | 0.02 | 1.01 | 0.92 | 1 | 0.4623 | −0.08 | 0.00 | 24 | 5.8 | 2 | 17.3 | 4.2 |
| Example 14 | 0.02 | 1.04 | 0.92 | 1 | 0.4690 | −0.07 | 0.00 | 23 | 5.83 | 1 | 17.55 | 4.7 |
| Example 15 | 0.01 | 1.01 | 0.94 | 1 | 0.4723 | −0.06 | 0.00 | 25 | 5.9 | 3 | 16.1 | 5 |
| Example 16 | 0.01 | 1.04 | 0.94 | 1 | 0.4792 | −0.05 | 0.00 | 24 | 5.93 | 3 | 17.8 | 5.3 |
| Example 17 | 0.03 | 1.04 | 0.94 | 1 | 0.4792 | −0.05 | 0.00 | 30 | 5.9 | 2 | 16 | 4.4 |
| Example 18 | 0.04 | 1.01 | 0.94 | 1 | 0.4723 | −0.06 | 0.00 | 22 | 5.82 | 2 | 18 | 4.5 |
| Example 19 | 0.04 | 1.08 | 0.94 | 1 | 0.4881 | −0.04 | 0.00 | 28 | 5.86 | 1 | 17.7 | 4.4 |
| Example 20 | 0.04 | 1.04 | 0.94 | 1 | 0.4792 | −0.05 | 0.00 | 66 | 5.84 | 1 | 16.7 | 4.2 |
| Example 21 | 0.04 | 1.04 | 0.92 | 1 | 0.4690 | −0.07 | 0.00 | 54 | 5.84 | 1 | 17.6 | 4.2 |
| Example 22 | 0.04 | 1.04 | 0.96 | 1 | 0.4894 | −0.03 | 0.00 | 44 | 5.86 | 1 | 17.1 | 4.2 |
| Example 23 | 0.05 | 1.05 | 0.94 | 1 | 0.4815 | −0.05 | 0.00 | 63 | 5.84 | 1 | 17.05 | 3.6 |
| Example 24 | 0.06 | 1.01 | 0.94 | 1 | 0.4723 | −0.06 | 0.00 | 50 | 5.77 | 1 | 14.2 | 3.3 |
| Example 25 | 0.06 | 1.08 | 0.94 | 1 | 0.4881 | −0.04 | 0.00 | 55 | 5.78 | 1 | 14.75 | 3.2 |
| Example 26 | 0.06 | 1.04 | 0.92 | 1 | 0.4690 | −0.07 | 0.00 | 63 | 5.75 | 1 | 14.4 | 3 |
| Example 27 | 0.06 | 1.04 | 0.94 | 1 | 0.4792 | −0.05 | 0.00 | 70 | 5.76 | 1 | 13.75 | 3 |
| Example 28 | 0.06 | 1.04 | 0.96 | 1 | 0.4894 | −0.03 | 0.00 | 65 | 5.78 | 1 | 15.05 | 3 |
| Example 29 | 0.02 | 1.04 | 0.94 | 0.9 | 0.4792 | −0.05 | −0.05 | 23 | 5.76 | 1 | 17.55 | 4.6 |
| Example 30 | 0.02 | 1.04 | 0.94 | 0.95 | 0.4792 | −0.05 | −0.02 | 25 | 5.82 | 2 | 17.3 | 4.8 |
| Example 31 | 0.02 | 1.04 | 0.94 | 1.05 | 0.4792 | −0.05 | 0.02 | 24 | 5.78 | 2 | 16.2 | 5 |
| Example 32 | 0.02 | 1.04 | 0.94 | 1.1 | 0.4792 | −0.05 | 0.05 | 23 | 5.65 | 2 | 16.5 | 5.1 |

TABLE 2

| | x | a/b | a + b | c | a | δ | ζ | Piezoelectric constant $d_{31}$ (pm/V) | Density (g/cm³) | Crystal grain size (μm) | $Y\alpha_1$ (kPa/K) | Coercive electric field (kV/mm) |
|---|---|---|---|---|---|---|---|---|---|---|---|---|
| Comparative Example 1 | 0.02 | 1.04 | 1 | 1 | 0.5098 | 0.01 | 0.00 | —*¹ | 5.69 | 2 | —*¹ | —*¹ |
| Comparative Example 2 | 0.02 | 1 | 0.94 | 1 | 0.4700 | −0.06 | 0.00 | 19 | 5.7 | 5 | 16.5 | 3.4 |
| Comparative Example 3 | 0.02 | 1.09 | 0.94 | 1 | 0.4902 | −0.04 | 0.00 | —*¹ | 5.9 | 0.5 | —*¹ | —*¹ |
| Comparative Example 4 | 0.02 | 1.04 | 0.91 | 1 | 0.4639 | −0.08 | 0.00 | 15 | 5.67 | 1 | 18.9 | 4.7 |
| Comparative Example 5 | 0 | 1 | 1 | 1 | 0.5000 | 0.00 | 0.00 | 10 | 5.68 | 10 | 21.7 | 5.5 |
| Comparative Example 6 | 0.02 | 1 | 1 | 1 | 0.5000 | 0.00 | 0.00 | 17 | 5.66 | 10 | 20.15 | 4.7 |
| Comparative Example 7 | 0.04 | 1 | 1 | 1 | 0.5000 | 0.00 | 0.00 | —*¹ | 5.6 | 9 | —*¹ | —*¹ |

TABLE 2-continued

|  | x | a/b | a + b | c | a | δ | ζ | Piezoelectric constant $d_{31}$ (pm/V) | Density (g/cm³) | Crystal grain size (μm) | $Yα_1$ (kPa/K) | Coercive electric field (kV/mm) |
|---|---|---|---|---|---|---|---|---|---|---|---|---|
| Comparative Example 8 | 0 | 1.04 | 0.94 | 1 | 0.4792 | −0.05 | 0.00 | 11 | 5.94 | 12 | 19.45 | 5.3 |
| Comparative Example 9 | 0.08 | 1.04 | 0.92 | 1 | 0.4690 | −0.07 | 0.00 | 11 | 5.76 | 0.5 | 14.1 | 14 |
| Comparative Example 10 | 0.08 | 1.04 | 0.94 | 1 | 0.4792 | −0.05 | 0.00 | 10 | 5.75 | 0.5 | 12.2 | 1.5 |
| Comparative Example 11 | 0.08 | 1.04 | 0.98 | 1 | 0.4996 | −0.01 | 0.00 | 12 | 5.74 | 0.5 | 12.5 | 1.6 |
| Comparative Example 12 | 0.1 | 1.04 | 0.94 | 1 | 0.4792 | −0.05 | 0.00 | —*² | 5.73 | 0.5 | —*² | —*² |
| Comparative Example 13 | 0.02 | 1.04 | 0.94 | 0.85 | 0.4792 | −0.05 | −0.08 | 7 | 5.72 | 0.5 | 19.1 | 4.5 |
| Comparative Example 14 | 0.02 | 1.04 | 0.94 | 1.15 | 0.4792 | −0.05 | 0.08 | 5 | 5.55 | 1 | 18.8 | 5.2 |
| Comparative Example 15 | 0.02 | 1.001 | 1.005 | 1 | 0.5028 | 0.01 | 0.00 | 16 | 5.77 | 10 | 20 | 4 |
| Comparative Example 16 | 0.015 | 1.06 | 0.985 | 1.1 | 0.5068 | 0.00 | 0.05 | 13 | 5.8 | 0.5 | 19.85 | 4.8 |
| Comparative Example 17 | 0.02 | 1.04 | 0.99 | 1 | 0.5047 | 0.00 | 0.00 | —*¹ | 5.72 | 5 | —*¹ | —*¹ |
| Comparative Example 18 | 0.02 | 1.08 | 0.99 | 1 | 0.5140 | 0.01 | 0.00 | —*¹ | 5.7 | 1 | —*¹ | —*¹ |
| Comparative Example 19 | 0.01 | 1.08 | 0.94 | 1 | 0.4881 | −0.04 | 0.00 | 16 | 5.88 | 1 | 19.7 | 5.4 |
| Comparative Example 20 | 0.01 | 1.04 | 0.99 | 1.06 | 0.5047 | 0.00 | 0.03 | 18 | 5.88 | 3 | 20.5 | 5.3 |

*¹not polarized because of breakdown or leakage
*²no piezoelectricity

Examples 33 to 36 and Comparative Examples 21 to 25

Piezoelectric/electrostrictive materials prepared in Examples 9, 17, 20, and 27 and Comparative Examples 8, 10, 15, 16, and 20 were applied to a Pt electrode disposed on a zirconium oxide substrate by screen printing. After firing at 1050° C., a piezoelectric/electrostrictive film was formed. A Au electrode was formed on the piezoelectric/electrostrictive film. A piezoelectric/electrostrictive element thus formed had a structure illustrated in FIG. 5 (Examples 33 to 36 and Comparative Examples 21 to 25). The piezoelectric/electrostrictive element had an S1/S2 of 0.47 (S1: effective area of electrodes, S2: area of cavity) and a $t_p/t_d$ of 1.3 ($t_p$: thickness of piezoelectric/electrostrictive portion, $t_d$: thickness of diaphragm portion). Table 3 shows the degree of variability (%) and the bending displacement (μm) of the piezoelectric/electrostrictive element. In Table 3, "○" in the "a<0.5" column indicates that "a<0.5" was satisfied and "x" indicates that "a<0.5" was not satisfied.

Comparative Example 26

A piezoelectric/electrostrictive element (Comparative Example 26) was prepared in the same way as Examples 33 to 36 and Comparative Examples 21 to 25 except that a PZT composition of "Pb(Zr$_{0.52}$Ti$_{0.48}$)O$_3$" was used. Table 3 shows the degree of variability (%) and the bending displacement (μm) of the piezoelectric/electrostrictive element.

TABLE 3

|  | x | a/b | a + b | c | a < 0.5 | δ | ζ | Degree of variability (%) | Bending displacement (μm) |
|---|---|---|---|---|---|---|---|---|---|
| Example 33 | 0.02 | 1.04 | 0.94 | 1 | ○ | −0.05 | 0.00 | 6 | 0.15 |
| Example 34 | 0.03 | 1.04 | 0.94 | 1 | ○ | −0.05 | 0.00 | 6 | 0.16 |
| Example 35 | 0.04 | 1.04 | 0.94 | 1 | ○ | −0.05 | 0.00 | 7 | 0.22 |
| Example 36 | 0.06 | 1.04 | 0.94 | 1 | ○ | −0.05 | 0.00 | 10 | 0.24 |
| Comparative Example 21 | 0 | 1.04 | 0.94 | 1 | ○ | −0.05 | 0.00 | —*¹ | —*¹ |
| Comparative Example 22 | 0.08 | 1.04 | 0.94 | 1 | ○ | −0.05 | 0.00 | 15 | 0.08 |
| Comparative Example 23 | 0.02 | 1.001 | 1.005 | 1 | x | 0.01 | 0.00 | —*¹ | —*¹ |
| Comparative Example 24 | 0.015 | 1.06 | 0.985 | 1.1 | x | 0.00 | 0.05 | —*¹ | —*¹ |
| Comparative Example 25 | 0.01 | 1.04 | 0.99 | 1.06 | x | 0.00 | 0.03 | —*¹ | —*¹ |

TABLE 3-continued

|  | x | a/b | a + b | c | a < 0.5 | δ | ζ | Degree of variability (%) | Bending displacement (μm) |
|---|---|---|---|---|---|---|---|---|---|
| Comparative Example 26 |  |  | $Pb(Zr_{0.52}Ti_{0.48})O_3$ |  |  |  |  | 19 | 0.25 |

*[1]breakdown during polarization

A piezoelectric/electrostrictive material according to the present invention can provide a piezoelectric/electrostrictive element having excellent piezoelectric/electrostrictive characteristics. The piezoelectric/electrostrictive element is suitable for an actuator or a sensor.

What is claimed is:

1. A piezoelectric/electrostrictive material having a nonstoichiometric composition represented by a general formula (1):

$$(1-x)(Bi_aNa_bTiO_{3+\delta})-x(K_cNbO_{3+\zeta}) \quad (1)$$

wherein $0.01 \leq x < 0.08$, $a < 0.5$, $1.01 \leq (a/b) \leq 1.08$, $0.92 \leq (a+b)/c < 0.99$, and $0.9 \leq c \leq 1.1$, and $\zeta \neq 0$ when $\delta = 0$ and $\delta \neq 0$ when $\zeta = 0$.

2. The piezoelectric/electrostrictive material according to claim 1, wherein x satisfies the relationship of $0.02 \leq x \leq 0.05$ in the general formula (1).

3. The piezoelectric/electrostrictive material according to claim 1, wherein x satisfies the relationship of $0.04 \leq x < 0.08$ in the general formula (1).

4. A piezoelectric/electrostrictive body formed of the piezoelectric/electrostrictive material according to claim 1.

5. The piezoelectric/electrostrictive body according to claim 4, wherein the piezoelectric/electrostrictive body is in the form of sheet.

6. A piezoelectric/electrostrictive element comprising:
a ceramic substrate; and
a piezoelectric/electrostrictive drive,
the piezoelectric/electrostrictive drive including:
at least one membranous piezoelectric/electrostrictive portion formed of the piezoelectric/electrostrictive material according to claim 1; and
at least two membranous electrodes electrically connected to the piezoelectric/electrostrictive portion, the piezoelectric/electrostrictive portion being fixed directly onto the substrate or via one of the electrodes onto the substrate.

7. The piezoelectric/electrostrictive element according to claim 6, wherein the at least one piezoelectric/electrostrictive portion is a plurality of piezoelectric/electrostrictive portions, and each of the plurality of piezoelectric/electrostrictive portions and each of the electrodes are alternately stacked such that each piezoelectric/electrostrictive portion is sandwiched between a pair of the electrodes.

8. The piezoelectric/electrostrictive element according to claim 6, wherein the substrate comprises a thin zirconia diaphragm portion and a thick zirconia portion disposed around the diaphragm portion, the diaphragm portion and the thick portion forming a cavity communicating with the outside of the substrate, and the piezoelectric/electrostrictive drive is disposed on the diaphragm portion opposite the cavity.

9. The piezoelectric/electrostrictive element according to claim 8, wherein the diaphragm portion vibrates in synchronization with the movement of the piezoelectric/electrostrictive drive, thereby permitting the piezoelectric/electrostrictive element to be used as a sensor.

10. The piezoelectric/electrostrictive element according to claim 8, wherein when the piezoelectric/electrostrictive portion is fixed on the substrate via one of the electrodes, the effective area of the electrode disposed on the substrate is 0.45 to 0.5 times the area of a two-dimensional image of the cavity projected on the substrate, the ratio $(t_p/t_d)$ of the thickness $(t_p)$ of the piezoelectric/electrostrictive portion to the thickness $(t_d)$ of the diaphragm portion is in the range of 1 to 1.5, and the degree of variability of the ratio ($|Ec^+|/|Ec^-|$) of a positive coercive electric field ($Ec^+$) to a negative coercive electric field ($Ec^-$) at a bipolar driving frequency in the range of 1 to 100 Hz is 10% or less.

11. The piezoelectric/electrostrictive element according to claim 8, wherein when the piezoelectric/electrostrictive portion is fixed on the substrate via one of the electrodes, the effective area of the electrode disposed on the substrate is 0.45 to 0.5 times the area of a two-dimensional image of the cavity projected on the substrate, the ratio $(t_p/t_d)$ of the thickness $(t_p)$ of the piezoelectric/electrostrictive portion to the thickness $(t_d)$ of the diaphragm portion is in the range of 1 to 1.5, and the displacement of the diaphragm portion during unipolar driving is at least 0.2 μm.

12. The piezoelectric/electrostrictive body according to claim 4, wherein the body comprises crystal grains having an average particle size of no more than 7 μm.

13. The piezoelectric/electrostrictive body according to claim 12, wherein the average particle size is from 1-5 μm.

14. The piezoelectric/electrostrictive body according to claim 13, wherein the average particle size is from 1-3 μm.

* * * * *